United States Patent [19]

Hoffmann

[11] Patent Number: 4,520,228

[45] Date of Patent: May 28, 1985

[54] MULTI-LAYER CONDUCTOR PLATE AND A METHOD OF MAKING

[75] Inventor: Horst Hoffmann, Glonn, Fed. Rep. of Germany

[73] Assignee: Wilhelm Ruf KG, Munich, Fed. Rep. of Germany

[21] Appl. No.: 410,983

[22] Filed: Aug. 24, 1982

[30] Foreign Application Priority Data

Sep. 18, 1981 [DE] Fed. Rep. of Germany ....... 3137279

[51] Int. Cl.³ .............................................. H05K 1/09
[52] U.S. Cl. ..................................... 174/68.5; 361/414
[58] Field of Search ........................ 361/414; 174/68.5

[56] References Cited

U.S. PATENT DOCUMENTS

| | | | |
|---|---|---|---|
| 3,167,490 | 1/1965 | Friedman | 204/15 |
| 3,560,256 | 2/1971 | Abrams | 174/68.5 |
| 3,798,762 | 3/1974 | Harris et al. | 29/626 |
| 3,998,677 | 12/1976 | Anderson et al. | 156/659.1 |
| 4,402,135 | 9/1983 | Schweingrubner et al. | 174/68.5 X |
| 4,440,823 | 4/1984 | Hoffmann | 174/68.5 X |

FOREIGN PATENT DOCUMENTS 2558367 7/1976 Fed. Rep. of Germany ...... 156/902
635947 4/1950 United Kingdom .

OTHER PUBLICATIONS

"Method for Producing Three Dimensional Printed Circuits", by Klippel, IBM, Tech. Dis. Bulletin, vol. 2, No. 4, Dec. 1959, pp. 7 and 8.

Primary Examiner—R. R. Kucia
Attorney, Agent, or Firm—Cushman, Darby & Cushman

[57] ABSTRACT

A multi-layer conductor plate consists of a copper-clad base plate (1) on which a first layer of conductor paths (2,3,4; 5,6,7) is formed by applying an etch-resistant, electrically conductive varnish at the respective locations. The copper layers not covered by the etch-resistant varnish are removed by etching in etching bath. Subsequently an insulating varnish layer (16) is applied at least in the area of intersections of conductor paths of the first layer and a second layer. A varnish adapted to be galvanized and preferably being carbonaceous is applied at predetermined locations and subsequently coated with a metal layer applied galvanically.

3 Claims, 3 Drawing Figures

MULTI-LAYER CONDUCTOR PLATE AND A METHOD OF MAKING

The instant invention relates to a multi-layer conductor plate and to a method of making the same according to patent application Ser. No. 246,153, filed Mar. 23, 1981 now abandoned (based on corresponding West German patent application P 30 13 667.5). The parent patent describes a method of producing multi-layer conductor plates and its basic idea essentially resides in using an electrically conductive, etch-resistant varnish as a so-called "etching reserve". Among others this has the advantage that the varnish is disposed electrically parallel to the conductor paths so as to reduce the resistance thereof. Furthermore, this varnish prevents oxidation of the conductor paths disposed underneath, an essential advantage particularly if the conductor paths are made of copper.

To apply a second conductor path layer it is suggested in the parent patent that a layer of insulating varnish be applied on the first conductor path layer at least in the area of intersections between the first and second conductor path layers. If this second conductor path layer serves to form so-called bridges, the connecting areas (piers) between the two layers are not covered with insulating varnish. The second layer of conductor paths and especially the bridges then are applied in the form of an electrically conductive varnish, such as a resistance varnish.

The instant invention is to improve the method of the parent patent or the conductor plate disclosed by the same such that the electrical conductivity of the second conductor path layer is improved, particularly in the area of the bridges by simple manufacturing steps.

To solve this problem, the instant invention suggests that the electrically insulating varnish forming the second conductor path layer be adapted to be galvanized and that upon solidifying of this varnish a metal layer be applied galvanically on the same.

In the resulting conductor plate the electrically conductive varnish forming the second conductor path layer is adapted to be galvanized and a galvanically applied metal layer is disposed on this galvanizable varnish.

The galvanizable varnish preferably is carbonaceous, consisting, for example, of a "carbon layer resistance varnish" which contains carbon black or graphite.

The metal layer applied galvanically preferably contains corrosion-resistant metal, particularly metallic contact materials.

It is particularly easy to apply the carbonaceous varnish by screen printing techniques.

Further improvement is obtained in that the varnish adapted to be galvanized is applied in windows of the insulating varnish, windows which are provided in the connecting areas (piers) between the first and second conductor paths or, in addition, also at switch contact areas and/or soldering areas. Except for these windows, therefore, the insulating varnish covers the entire first conductor path layer. The insulating varnish which must be applied to separate the two conductor path layers, in addition, takes over the function of a galvanizing mask which otherwise would have to be applied in an additional operational step. This guarantees that indeed only those locations are galvanized which actually need to be.

Of course, it is a condition for galvanizing that all locations to be galvanized are accessible electrically so as to be connected to the cathode of the galvanizing means. If not all the conductor paths of the finished conductor plate extend to the edge of the conductor plate, the above requirement can be met in that auxiliary connections are provided which later on are removed when subjecting the conductor plate to punching or drilling procedures.

If those points of the conductor paths to be soldered are likewise coated with a galvanically applied metal layer, this provides the advantage that this metal layer is adapted to be soldered so that the electrically conductive varnish which is disposed on top of the first conductor path layer and is not adapted to be soldered or can be soldered with difficulty only, need not be removed prior to the soldering. Thus another operational step is saved.

The invention will be described further, by way of example, with reference to the accompanying drawing, in which.

The same reference numerals are used in the various figures to designate the same parts.

A copper-clad base plate 1 consists of a layer of an electrically non-conductive material, such as hard paper and a copper layer superimposed on the same. In a first operational step a layer of etch-resistant electrically conductive varnish in the form of the desired conductor paths 2, 3, 4 and, if desired, including "piers" 5, 6, and switch contact areas 7 is applied on the copper layer. This application, preferably, is carried out by a screen printing technique. Upon solidifying of the varnish the copper layer not covered by the same is removed by etching in an etching bath so that only the copper coated by the varnish remains on the base plate 1.

Figure 1:
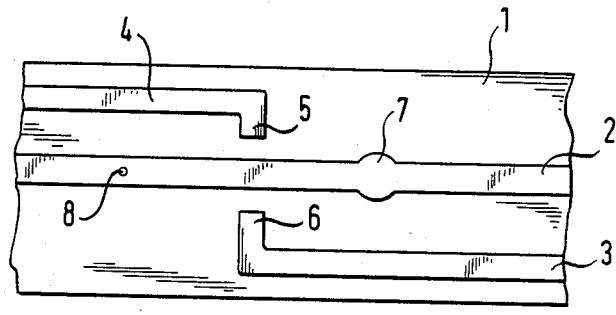
FIG. 1 is a diagrammatic top plan view of a conductor plate after making the first conductor path layer.
Figure 2:
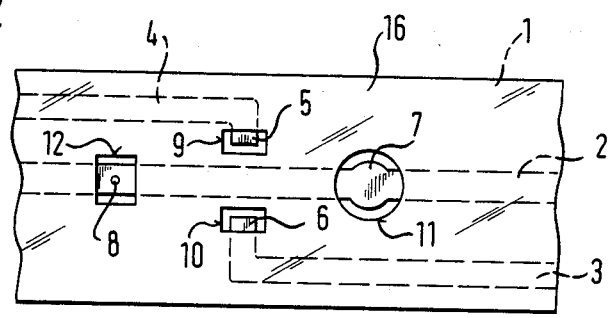
FIG. 2 is a view similar to FIG. 1 upon application of the insulating varnish.

As shown in FIG. 2, this operational step is followed by applying, preferably printing an insulating varnish 16 at least on those locations of the conductor plate which later on will be provided with the conductor paths of the second layer. In the embodiment shown the major portion of the conductor plate is coated with the insulating layer 16 and only individual places or windows 9, 10, 11, 12 are left free. In windows 9 and 10 the "piers" 5 and 6 are free, in window 11 the switch contact area 7 is free, and in window 12 a soldering spot is free comprising a bore 8 which passes through the base plate 1.

Upon solidifying of the insulating varnish 16 another operational step is taken to apply a carbonaceous, electrically conductive varnish at desired locations, preferably by way of a screen printing technique. Specifically this relates to a bridge 13 interconnecting the piers 5 and 6. The bridge thus is applied through the windows 9 and 10 as well as over the layer of insulating varnish 16 disposed between these windows.

Furthermore, also the switch contact area 7 and/or the soldering area could be printed with layers 14 and 15, respectively, of the carbonaceous varnish. At the end of this operational step the conductor plate is in the condition shown in FIG. 3.

In the final operational step the ends (not shown) of the conductor paths 2 and 4 and 3 which go as far as the edge of the conductor plate 1 are connected to an electrode (cathode) of a galvanizing means. In the subsequent galvanizing process the carbon varnish layers 13, 14, 15 are galvanized, i.e. coated with a metal layer which preferably contains essentially copper.

Figure 3:
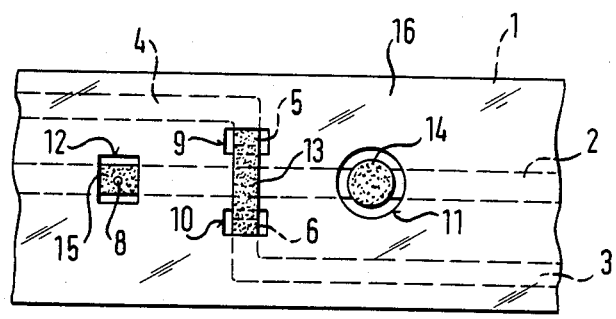
FIG. 3 is a top plan view of the finished conductor plate.

FIG. 3 shows that all the carbon varnish layers are connected electrically with the conductor paths 2, 3, and 4, respectively, so that their electrical connection to the galvanizing means causes no problem.

The fact that the metal layer applied galvanically is disposed electrically in parallel with the carbon varnish layer provides a considerable reduction of the electrical resistance of these layers so that problems are eliminated which might be caused by undue voltage drop and the heat development this involves.

The conductivity provides less transition resistance at the switch contact places, such as locations 7 and 14, while good suitibility for soldering is maintained at the soldering spots by the galvanically applied metal layer, for example at location 15.

Furthermore, it can be seen that it is guaranteed that indeed only those spots are provided with the galvanically applied metal layer which are intended to be, and yet no expensive preparation of a galvanizing mask is needed.

It should also be noted that the etch-resistant, electrically conductive varnish covering the conductor paths of the first layer may also be resistant to galvanic layers, i.e. that no metal layers may be deposited on the same by galvanic means. In this case it is not necessary to print the entire conductor plate, except for the windows 9, 10, 11, 12, with insulating varnish 16. Rather, it is sufficient to apply insulating varnish only in the areas of the intersections, i.e. in an area connecting piers 5 and 6 in the embodiment shown.

Instead of coating the soldering area 15 by galvanic means, it is also possible to remove the etch-resistant, electrically non-conductive varnish from the soldering spot so as to prepare this spot for soldering. If desired, this spot may further be subjected to de-oxidizing.

All the features to be gathered from the specification, claims, and drawing as well as advantages of the invention, including structural details and arrangements in space may be essential for the invention either individually or in any desired combination.

What we claim is:

1. A multi-layer conductor plate, comprising:
   a base plate means made of electrical insulation material, said base plate means being of substantial facial extent;
   a first layer of copper provided on a face of said base plate means in the form of at least one conductor path which is continuous along at least a portion of said face, said one conductor path having laterally opposite edges, and in the form of at least another conductor path which would crossingly intersect said one conductor path if said other conductor path were to be continuous, but said other conductor path being discontinuous adjacent said lateral edges of said one conductor path so as to provide two respective piers;
   a layer of etch-resistant, electrically conductive varnish superimposed upon at least some of said first layer of copper in said conductor paths;
   a layer of electrical insulation material superimposed upon said face at least in said portion so as to cover all of said etch-resistant electrically conductive varnished copper layer conductor paths except for being apertured by aperture means at a plurality of conductor attachment sites, including ones coinciding with both of said piers;
   a layer of galvanizable electrically conductive varnish, this layer being selectively applied upon said layer of electrical insulation material and upon selected ones of said sites so as to define a second layer of electrical conductor paths, this second layer including an electrical conductor path which electrically connects between said piers of said second conductor path while crossing-over but being electrically insulated from said first conductor path by said layer of electrical insulation material; and
   a galvanically-applied metal layer provided upon said galvanizable electrically conductive varnish, thereby bridging said piers.

2. The conductor plate as claimed in claim 1, characterized in that the galvanizable varnish is carbonaceous.

3. The conductor plate as claimed in claim 1, characterized in that the galvanically-applied metal layer contains corrosion-resistant metallic contact materials.

* * * * *